(12) United States Patent
Möller et al.

(10) Patent No.: US 6,984,934 B2
(45) Date of Patent: Jan. 10, 2006

(54) MICRO-LENS ARRAYS FOR DISPLAY INTENSITY ENHANCEMENT

(75) Inventors: Sven Möller, Princeton, NJ (US); Stephen R. Forrest, Princeton, NJ (US)

(73) Assignee: The Trustees of Princeton University, Princeton, NJ (US)

( * ) Notice: Subject to any disclaimer, the term of this patent is extended or adjusted under 35 U.S.C. 154(b) by 83 days.

(21) Appl. No.: 10/191,306

(22) Filed: Jul. 9, 2002

(65) Prior Publication Data

US 2003/0020399 A1 Jan. 30, 2003

Related U.S. Application Data

(60) Provisional application No. 60/304,531, filed on Jul. 10, 2001, and provisional application No. 60/315,902, filed on Aug. 30, 2001.

(51) Int. Cl.
*H05B 33/00* (2006.01)

(52) U.S. Cl. .................... 313/504; 313/506
(58) Field of Classification Search ......... 313/500–512, 313/498; 359/619
See application file for complete search history.

(56) References Cited

U.S. PATENT DOCUMENTS

| 5,300,263 | A  | 4/1994  | Hoopman et al. ........... 264/2.5 |
| 5,703,436 | A  | 12/1997 | Forrest et al. .............. 313/506 |
| 5,707,745 | A  | 1/1998  | Forrest et al. .............. 428/432 |
| 5,796,509 | A  | 8/1998  | Doany et al. ............... 359/254 |
| 5,948,281 | A  | 9/1999  | Okazaki et al. ............... 216/26 |
| 6,245,393 | B1 | 6/2001  | Thompson et al. ......... 427/511 |
| 6,303,238 | B1 | 10/2001 | Thompson et al. ......... 428/690 |
| 6,337,102 | B1 | 1/2002  | Forrest et al. ............... 427/64 |

FOREIGN PATENT DOCUMENTS

| WO | WO 00/57676 | 9/2000 |
| WO | WO 00/70655 | 11/2000 |

OTHER PUBLICATIONS

PCT International Search Report dated Dec. 10, 2002 (PCT/US02/21786).
Tsutsui, T., et al., "Doubling coupling-out efficiency in organic light–emitting devices using a thin silica aerogel layer," *Adv. Mater.*, 2001, 13, 1149–1152.

*Primary Examiner*—Joseph Williams
(74) *Attorney, Agent, or Firm*—Kenyon & Kenyon

(57) ABSTRACT

A microlens array for a light emitting device is disclosed. The light emitting device includes a plurality of OLEDs, each OLED having a minimum planar dimension. The array includes a plurality of microlenses, each of which has a minimum planar dimension and a maximum planar dimension. The minimum planar dimensions of the microlenses are larger than the maximum wavelength of visible light emitted from the OLEDs. The maximum planar dimensions of the microlenses are smaller than the smallest minimum planar dimension of any of the OLEDs.

16 Claims, 11 Drawing Sheets

(2 of 11 Drawing Sheet(s) Filed in Color)

MICRO-LENS ARRAYS FOR DISPLAY INTENSITY ENHANCEMENT

CROSS-REFERENCE TO RELATED APPLICATIONS

This application claims priority from U.S. Provisional Patent Application Ser. No. 60/304,531, filed Jul. 10, 2001, the contents of which are incorporated herein by reference. This application claims priority from U.S. Provisional Patent Application Ser. No. 60/315,902, filed Aug. 30, 2001, the contents of which are incorporated herein by reference.

FIELD OF THE INVENTION

This invention relates generally to the field of light emitting devices, and more particularly to organic light emitting devices and microlens arrays for enhancing the coupling efficiency thereof.

BACKGROUND OF THE INVENTION

Access to the Internet and the need to download and view vast quantities of data at greater and greater speeds, along with a frequent requirement for portability and a small footprint are placing greater demands on the capabilities of display devices. The display device of choice for such applications is a flat-panel display, but the current liquid crystal display (LCD) technology in use by most flat-panel displays is limited in its ability to meet these increasing demands. A new display technology, however, offers considerable promise for overcoming the limitations of the LCD technology. That new technology is based on the application of organic light-emitting devices (OLEDs), which make use of thin film materials that emit light when excited by an electric current.

The typical OLED 10, as shown in FIG. 1A, includes a multi-layer sandwich of a planar glass substrate 12, an anode layer 14 of Indium Tin Oxide (ITO), at least one organic layer 16, and a reflecting cathode 18. Typically, the glass substrate 12 has a thickness, $t_{sub}$, of about 1 mm and an index of refraction, $n_{sub}$, of about 1.5. The ITO layer 14 has a typical thickness, $t_{ITO}$, of about 100 nm and an index of refraction, $n_{ITO}$, of about 1.8. The organic layer 16 has a typical thickness, $t_{org}$, of about 100 nm, and an index of refraction, $n_{org}$, of between about 1.6 and 1.8. The cathode 18 is usually made of Mg:Ag or Li:Al. As shown, the device can include an electron transporting (ETL) and electroluminescent (EL) layer 16a of aluminum tris(8-hydroxyquinoline) (Alq$_3$), with an index of refraction, $n_{alq}$, of about 1.72. The device can include a hole transporting layer (HTL) 16b of 4, 4'-bis[N-(1-napthyl)-N-phenyl-amino]biphenyl (α-NPD), with an index of refraction, $n_{NPD}$, of about 1.78.

Organic light emitting devices (OLEDs) make use of thin film materials that emit light when excited by electric current. A representative organic emissive structure is referred to as the double heterostructure (DH) OLED, shown in FIG. 1B. In this device, a substrate layer of glass 110 is coated by a thin layer of a transparent, conductive oxide such as indium-tin-oxide (ITO) 111. Next, a thin (100–1000 Å) organic hole transporting layer (HTL) 112 is deposited on ITO layer 111. Deposited on the surface of HTL 112 is a thin (typically, 50–1000 Å) emission layer (EL) 113. The EL 113 provides the recombination site for electrons injected from a 100–1000 Å thick electron transporting layer 114 (ETL) with holes from the HTL 112. Examples of prior art ETL, EL and HTL materials are disclosed in U.S. Pat. No. 5,294,870, the disclosure of which is incorporated herein by reference.

The EL 113 is typically doped with a luminescent material to tune color of the OLED. The device as shown in FIG. 1B is completed by depositing metal contacts 115, 116 and top electrode 117. Contacts 115 and 116 are typically fabricated from indium or Ti:Pt:Au. Electrode 117 is often a dual layer structure consisting of an alloy such as Mg:Ag 117' directly contacting the organic ETL 114, and a thick, high work function metal layer 117" such as gold (Au) or silver (Ag) on the Mg:Ag. The thick metal 117" is opaque. When proper bias voltage is applied between top electrode 117 and contacts 115 and 116, light emission occurs from emissive layer 113 through the glass substrate 110. In this case, the ETL 114 is typically doped with a luminescent material.

Another known organic emissive structure referred to as a single heterostructure (SH) is shown in FIG. 1C. The difference between this structure and the DH structure is that multifunctional layer 113' serves as both EL and ETL. One limitation of an un-doped device is that the multifunctional layer 113' must have good electron transport capability.

Yet another known LED device is shown in FIG. 1D, illustrating a typical cross sectional view of a single layer (polymer) OLED. As shown, the device includes a glass substrate 40 coated by a thin ITO layer 30. A thin organic layer 50 of spin-coated polymer, for example, is formed over ITO layer 30, and may provide all of the functions of the HTL, ETL, and EL layers of the previously described devices. A metal electrode layer 60 is formed over organic layer 50. The metal is typically Mg, Ca, Li or other conventionally used low work function metal.

An example of a multicolor electroluminescent image display device employing organic compounds for light emitting pixels is disclosed in U.S. Pat. Nos. 5,703,436 and 5,707,745. These patents disclose a plurality of light emitting pixels that contain an organic medium for emitting red, green, and/or blue light.

An important figure of merit for a display system is the efficiency of conversion of input power to emitted light. In OLED displays, a critical factor in determining this system efficiency is coupling efficiency ($\eta_{ext}$) with which internally generated light is coupled out of the device. As shown in FIG. 1A, a large fraction of light generated in an OLED is never coupled out of the device (a) since it is waveguided in either the ITO electrode (c), the organic layers, or the transparent substrate (b). This waveguided light is either absorbed in the structure of the device or coupled out of the edges of the device. In order to meet expected demands of future display systems, there is a need to improve the coupling efficiency of OLEDs.

SUMMARY OF THE INVENTION

The present invention is directed to micro-lens arrays for enhancing light coupling efficiency of light emitting devices containing OLEDs. In preferred embodiments, such a microlens array may include a plurality of microlenses. Each of the microlenses has a minimum planar dimension and a maximum planar dimension. The minimum planar dimensions of the microlenses are larger than the maximum wavelength of visible light emitted from the OLEDs. The maximum planar dimensions of the microlenses are smaller than the smallest minimum planar dimension of any of the plurality of OLEDs.

Such a microlens can have a generally rectangular planar base, and be generally mesa-shaped. The maximum planar dimensions of each of the microlenses can be substantially the same, and can range from about 2 micrometers to about 20 micrometers. Preferably, the maximum planar dimension of each of the microlenses is about 10 micrometers. The microlens array can have a lens density of from about 5,000 to about 1,000,000 lenses per square millimeter.

The array can be a polymer laminate, such as a polymer selected from polymethylmethacrylates, polyvinylcarbazoles, polybutadienes, polyethylenes, and polyesters. The array could also be glass.

A method according to the invention for increasing the coupling efficiency of a light emitting device can include directing light output from the OLEDs through a such a microlens array. A light emitting device according to the invention can include at least one OLED having a first electrode, a second electrode, an organic layer disposed between the first electrode and the second electrode, and a substrate disposed on a surface of the second electrode. The organic layer, which can include an electron transporting layer, an electroluminescent layer, and a hole transporting layer, emits light upon application of a voltage between the first and second electrodes. The substrate has a plurality of microlenses disposed on a surface thereof, where the maximum planar dimensions of the microlenses are smaller than the smallest minimum planar dimension of any of the OLEDs. The light emitted by the organic layer has a wavelength that is smaller than the smallest minimum planar dimension of the microlenses.

The patent or application file contains at least one drawing executed in color. Copies of this patent or patent application with color drawing(s) will be provided by the office upon request and payment of the necessary fee.

DETAILED DESCRIPTION OF PREFERRED EMBODIMENTS

Figure 1A:
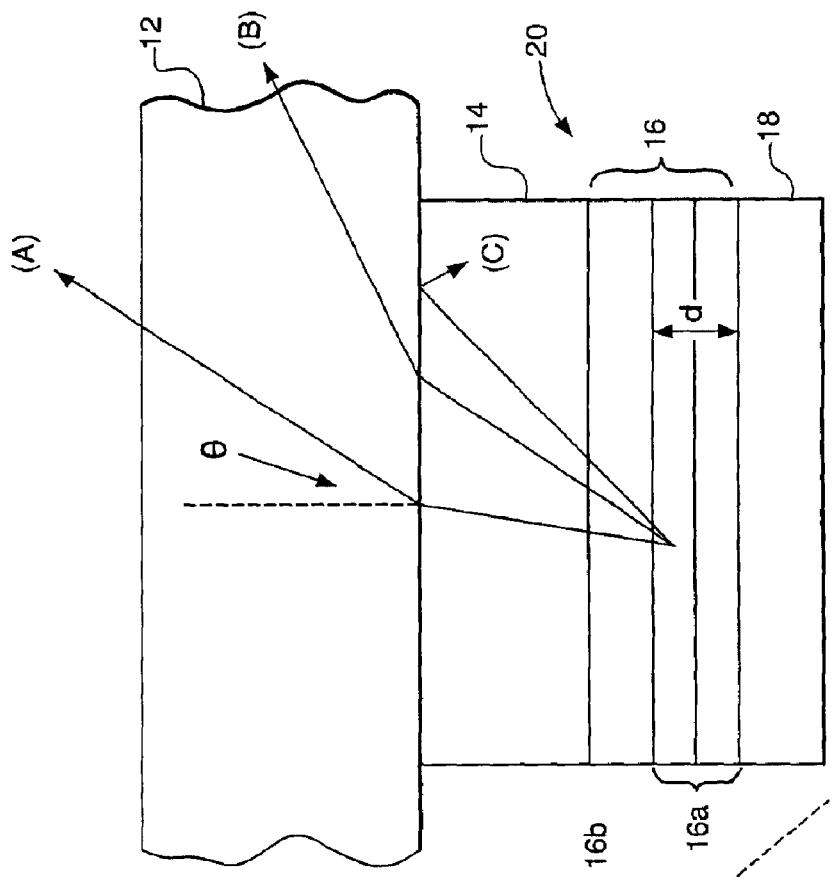
FIGS. 1A–1D are cross-sectional views of typical prior art light emitting devices incorporating OLEDs.
Figure 1A:
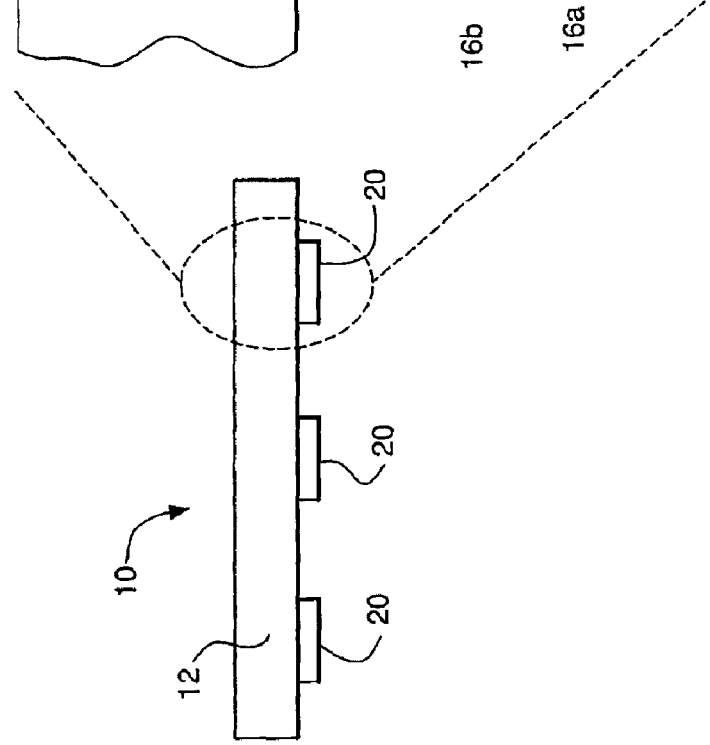
Figure 1B:
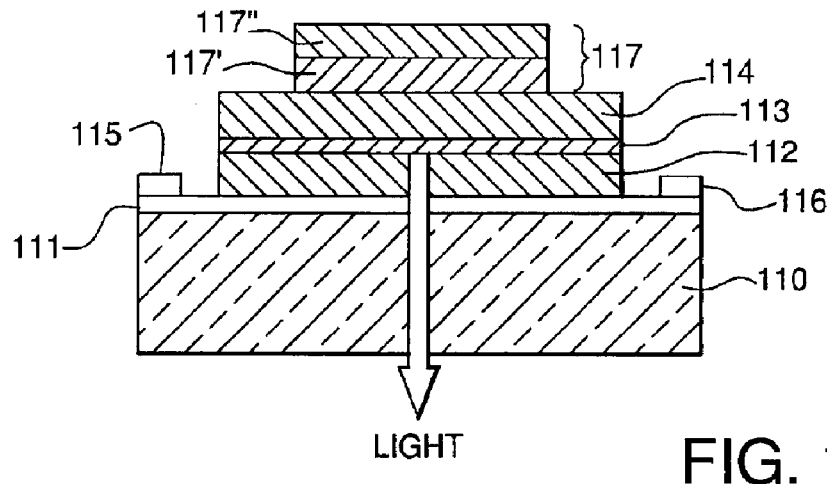
Figure 1C:
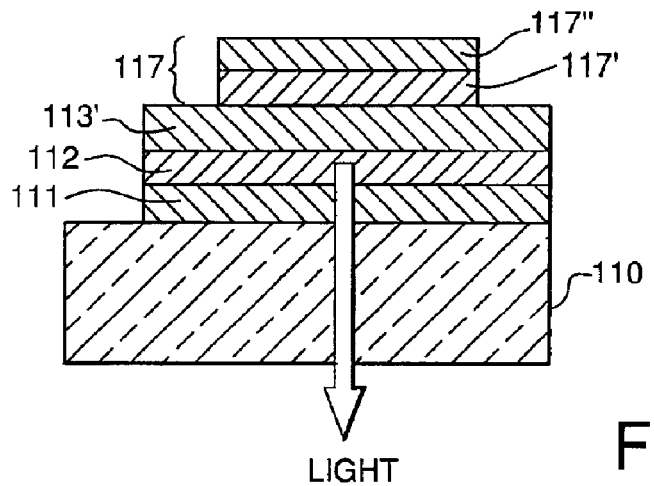
Figure 1D:
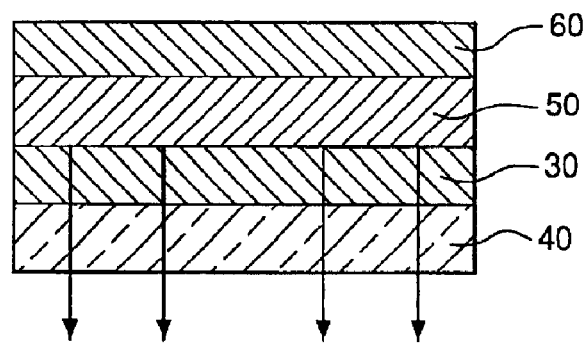
Figure 2:
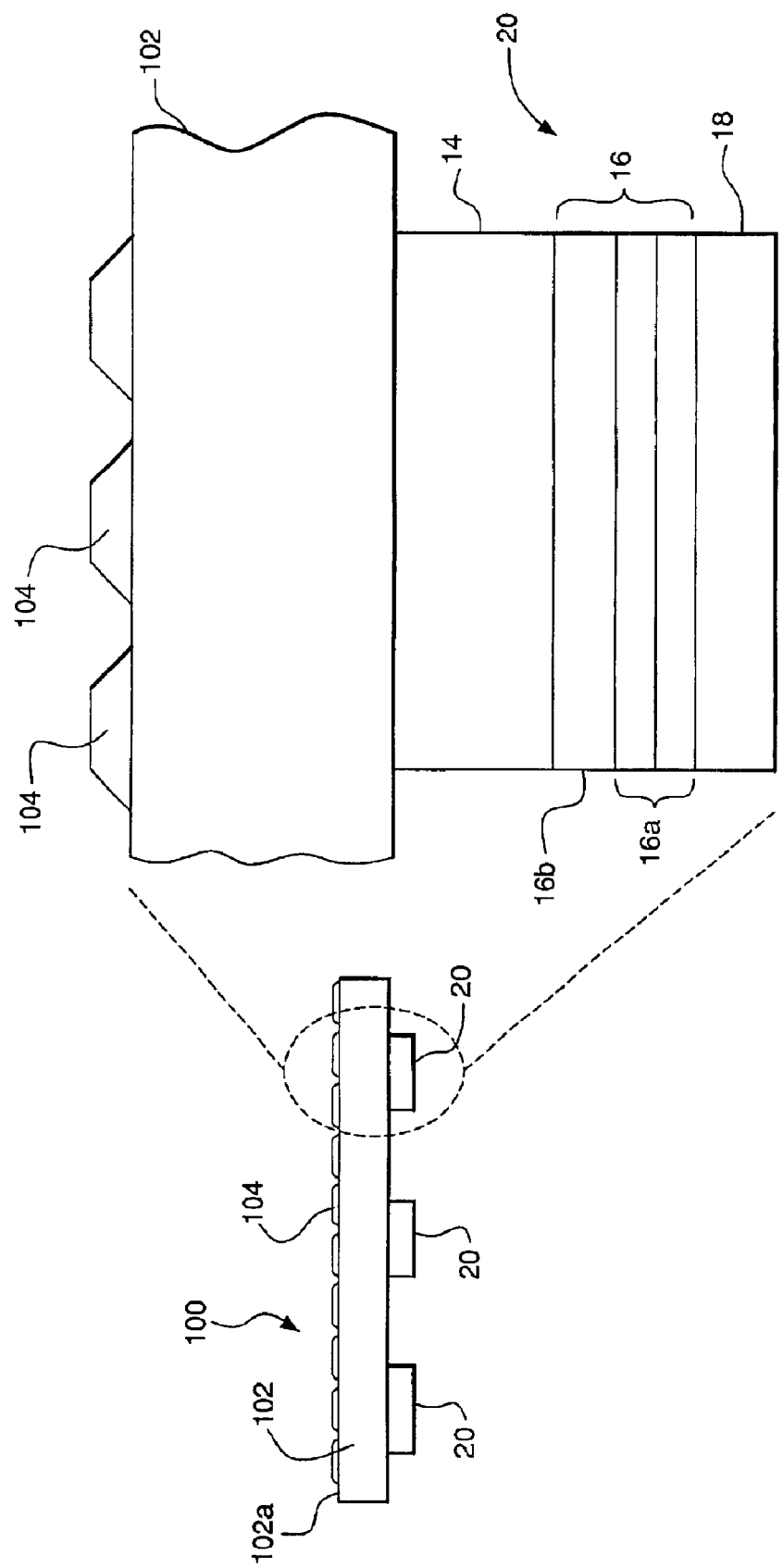
FIG. 2 is a cross-sectional view of a preferred embodiment of an OLED containing light emitting device according to the invention.

A light emitting device according to the invention can include, as shown in FIG. 2, a microlens substrate 102 and a plurality of organic light emitting devices (OLEDs) 20. Each OLED 20 can include an anode layer 14, at least one organic layer 16, and a reflecting cathode 18. The anode layer 14 is typically made of Indium Tin Oxide (ITO), and has a typical thickness, $t_{ITO}$, of about 150 nm and an index of refraction, $n_{ITO}$, of about 1.8. The organic layer 16 has a typical thickness, $t_{org}$, of about 100 nm, and an index of refraction, $n_{org}$, of between about 1.6 and 1.8. The cathode 18 is typically made of Mg:Ag, Li:Al, Li$_2$O:Al, or LiF:Al. As shown, the device can include an electron transporting (ETL) and electroluminescent (EL) layer 16a of tris(8-hydroxyquinoline) aluminum (Alq$_3$), with an index of refraction, $n_{alq}$, of about 1.72. The device can include a hole transporting layer (HTL) 16b of 4, 4'-bis[N-(1-napthyl)-N-phenyl-amino] biphenyl (α-NPD), with an index of refraction, $n_{NPD}$, of about 1.78. For simplicity, the discussion herein will be based on a single organic layer, where the light emission occurs. However, those skilled in the art will readily understand that the discussion and analysis that follows can readily be extended to more complicated device structures.

According to one embodiment of the invention, the microlens substrate 102 has a thickness, $t_{sub}$, of about 1 mm, and an average index of refraction, $n_{sub}$, of about 1.5. According to another embodiment of the invention, the microlens substrate 102 has a thickness, $t_{sub}$, of less than about 0.5 mm. The microlens substrate 102 includes a plurality of microlenses 104 disposed on the surface 102a of the substrate 102. Each of the microlenses 104 can be of any of a variety of shapes. In some preferred embodiments each of the microlenses 104 has a minimum planar dimension and a maximum planar dimension, wherein the minimum planar dimensions of the microlenses are larger than the maximum wavelength of visible light emitted from the OLEDs, and the maximum planar dimensions of the microlenses are smaller than the smallest minimum planar dimension of any of the plurality of OLEDs.

Figure 3B:
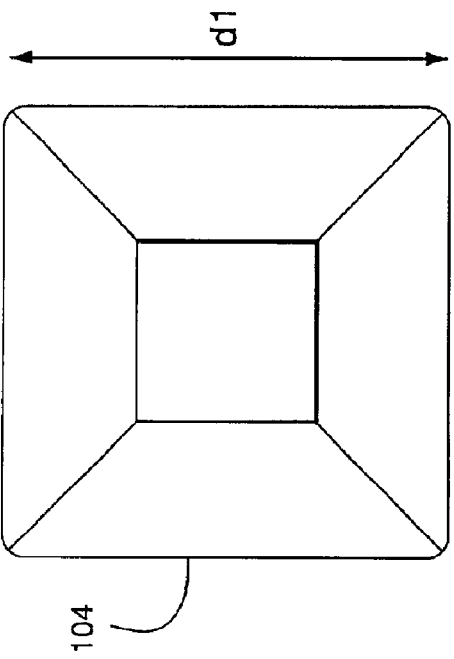
FIGS. 3B and 3C provide top and side views, respectively, of a preferred embodiment of a microlens for use in a microlens array according to the invention.
Figure 3C:
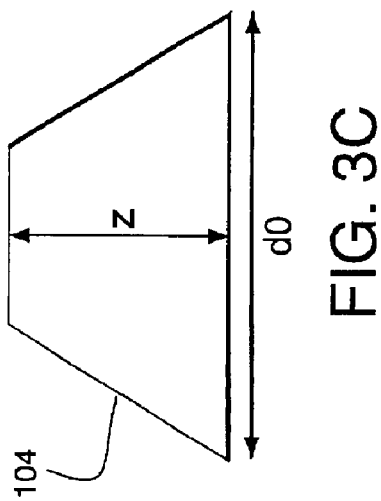
Figure 3A:
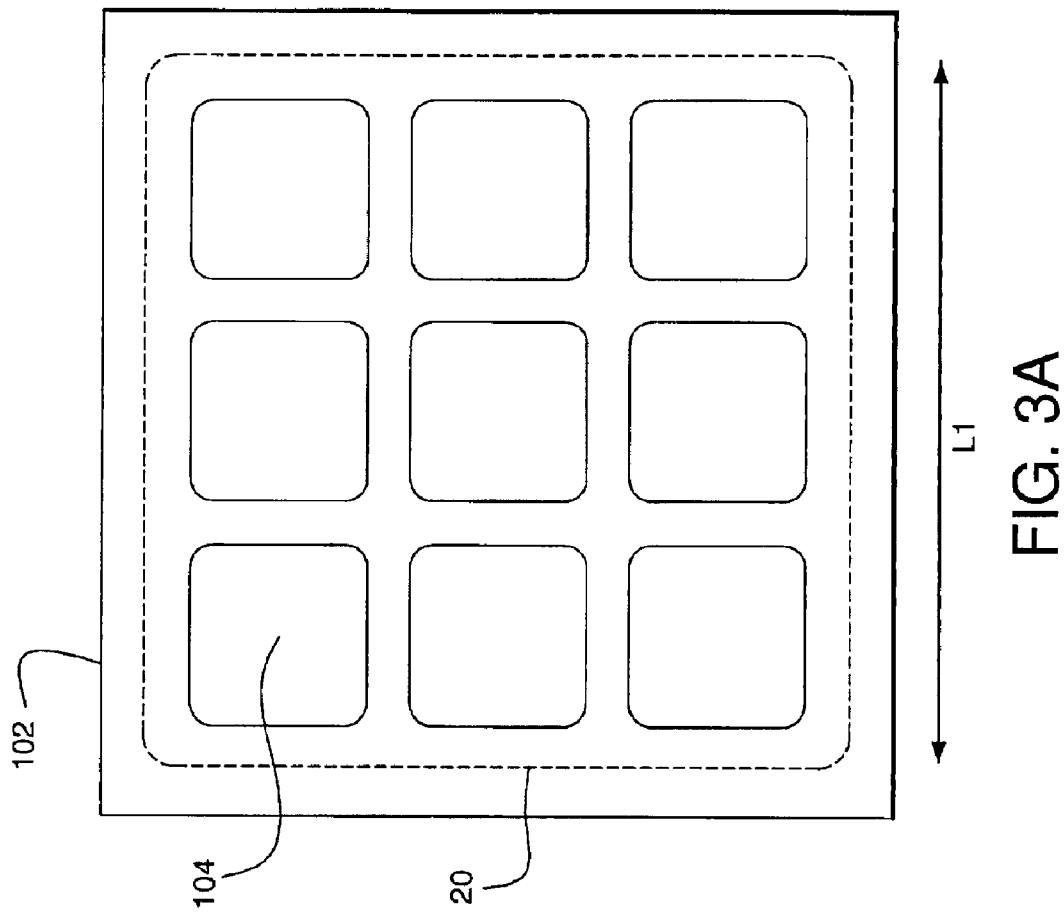
FIG. 3A provides a top view of a preferred embodiment of an OLED containing light emitting device according to the invention.

FIGS. 3B and 3C provide top and side views, respectively, of a preferred embodiment of a microlens for use in a microlens array according to the invention. Microlens 104 has a minimum planar dimension $d_0$, and a maximum planar dimension $d_1$, and a vertical dimension z. As shown, a preferred embodiment of a microlens according to the invention can be generally mesa-shaped and have a generally rectangular planar base. The term "mesa-shaped," as that term is used herein, should be construed to include such shapes as frustums, truncated pyramids, and the like. Similarly, the terms "generally mesa-shaped" and "generally rectangular" should be construed to include such shapes with slightly rounded corners, vertices, etc.

Preferably, the maximum planar dimension of microlens 104 is substantially smaller than the minimum planar dimension $L_1$ of the OLEDs in the device, and is substantially larger than the wavelength, $\lambda_0$, of the light that the organic layer emits light upon application of a voltage between the first and second electrodes. For example, in some embodiments, the minimum planar dimension of the OLED is on the order of from about 5 to about 250 microns, more preferably 50 to about 250 microns. Generally, the OLEDs have the dimensions as are known in the art to be useful in typical OLED applications, for example in pixels in displays. The wavelength, $\lambda_0$, of the emitted light is on the order of from about 350 to about 750 nm. Preferably, in embodiments having generally mesa-shaped microlenses, the dimensions $d_0$, $d_1$ of the microlens 104 are in the range from about 2 micrometers to about 20 micrometers. More preferably, the dimensions $d_0$, $d_1$ of the microlens 104 are in the range from about 2 micrometers to about 20 micrometers. Still more preferably, the dimensions $d_0$, $d_1$ of the microlens 104 are each on the order of about 10 microns. It should be understood, however, that the dimensions $d_0$, $d_1$ of the microlens 104 can be set to any lengths such that maximum planar dimension of microlens 104 is substantially smaller than $L_1$, and substantially larger than $\lambda_0$.

As used herein, the terms "minimum planar dimension" and "maximum planar dimension" as applied to an OLED is intended to mean, respectively, the minimum and maximum dimensions of the OLED measured in the plane of the organic OLED layer.

As used herein, the term "minimum planar dimension" and "maximum planar dimension" as applied to a microlens in a microlens array is intended to mean, respectively, the minimum and maximum dimensions of the microlens measured in the plane of the microlens array.

As used herein, the term "lens density" as applied to microlens arrays of the invention is intended to mean the number of microlenses per unit area of the surface of a microlens array. Preferably, the microlens arrays of the invention have lens densities of from about 5,000 to about 1,000,000 microlenses per square millimeter.

As used herein, the term "attaching a microlens array to a surface" is intended to mean the physical or chemical bonding of the laminate to a surface, for example by thermal adhesion, chemical adhesion (e.g., by gluing) and others means known in the art. Attaching also is intended to include forming the array on the surface of the substrate, for example by microlithography, molding, etching, or like mechanical or lithographic means.

The microlens substrate 102 can be fabricated from any transparent material, such as glass, quartz, sapphire, and polymeric materials including plastics. Examples of polymers from which substrate 102 can be fabricated include polymethylmethacrylates, polyvinylcarbazoles, polybutadienes, polyethylenes (for example polyethylene terephthalate) and polyesters.

In one embodiment, the substrate is a micro-patterned lenslet array formed from any of the foregoing materials, e.g. glass. In other embodiments, the substrate and microlens array can be formed separately, and the array can be attached to the substrate via a variety of means, for example by physical or chemical bonding of the array laminate to a surface of the substrate, for example by thermal adhesion, chemical adhesion (e.g., by gluing) or other means known in the art.

In some preferred embodiments, the microlens array, and/or the substrate 102 having the microlens array disposed thereon, is a polymer laminate. As used herein, the term "polymer laminate" is intended to mean a laminate composed of primarily of a polymeric material. Suitable polymeric materials for use in microlens arrays of the invention include polymethylmethacrylates, polyvinylcarbazoles, polybutadienes, polyethylenes (for example polyethylene terephthalate) and polyesters. Such embodiments are believed to provide benefits in both cost effectiveness and ease of manufacturing.

Additionally, the microlenses need not be aligned with the OLEDs in the light emitting device. That is, the microlens array can attached to the surface of the substrate, without regard for the positions of the microlenses on the substrate. The OLEDs can, therefore, be formed on the substrate by methods that are well known, without any need to align the OLEDs to the locations of the microlenses on the substrate. Alternatively, a microlens array laminate as described herein can be positioned on a substrate without any need to align any specific microlens with an OLED.

The high brightness light emission resulting from the devices of the present invention make such devices useful for xerography, copying, printing and display applications, particularly displays for hand held devices, and any other such applications where high brightness, monochromatic or multicolor light emission is required. Depending on the application, the embodiments as shown and described can be used singularly or as a plurality of pixels. For example, where the present invention is used to form a flat-panel linescan display device comprising a plurality of pixels, each light emitting device as herein described can represent an individual pixel or part thereof.

Figure 4A:
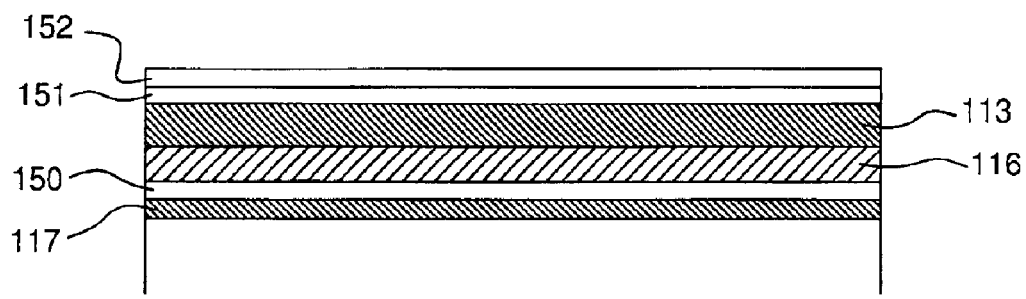
FIGS. 4A–4C are cross section views of alternate embodiments of OLED containing light emitting devices according to the invention.
Figure 4B:
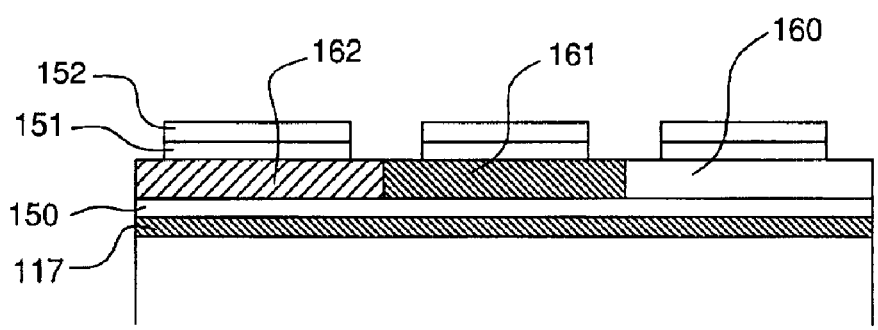
Figure 4C:
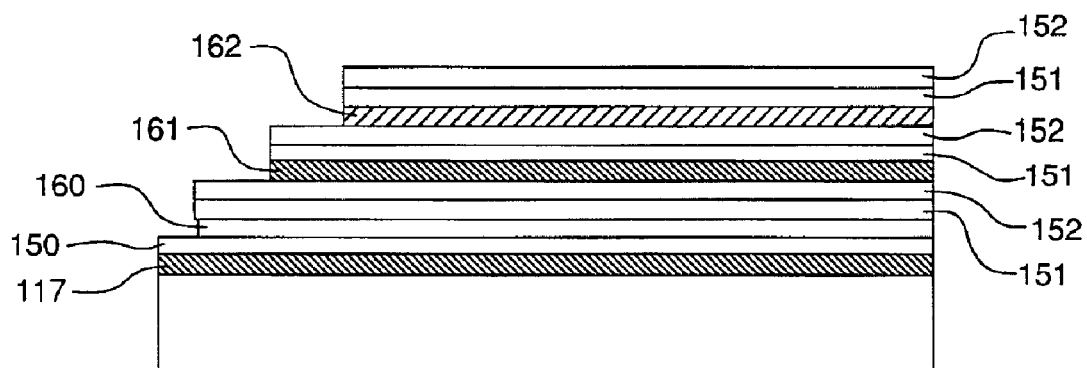

FIGS. 4A–4C show other embodiments of light emitting devices incorporating microlenses 104 according to the invention. Organic layer 113 can be of single or double heterostructure configuration, as is known in the art. For simplicity, the organic layers used in the present invention are shown as single layers in the drawings even though each organic layer actually comprises multiple sub-layers if the organic layer is not a single-layer polymer, as is known in the art.

As shown in FIG. 4A, a low work function (preferably, <4 eV) metal layer 151 is formed on top of organic layer 113. Suitable candidates for metal layer 151 include Mg, Mg:Ag, $Li_2O$:Al, LiF:Al and Li:Al. Metal layer 151 serves as a contact material for organic layer 113 and as a reflective material for reflection of impinging light beams. Deposited on the top of metal layer 151 is another conductive layer 152 suitable for forming an electrical contact. Conductive layer 152 can be made of ITO, Al, Ag, or Au, for example. Light emission from the organic layer 113 occurs when a voltage is applied between conductive layer 150 and conductive layer 152, thereby causing emission from the EL of organic layer 113. A layer of phosphor 116 may optionally be included for light energy down conversion of the light emitted from the organic emission layer to a desired color. The embodiment shown in FIG. 4A will produce monochromatic light emission.

Alternatively, to facilitate multicolor applications, organic layer 113 can include a blue organic layer 160, a green organic layer 161, and a red organic layer 162 as shown in FIG. 4B. Each of the blue, green, and red organic layers can be individually addressed for the independent emission of blue, green, and red light, respectively.

In a further embodiment of the present invention, blue, green and red organic layers are arranged in a stacked configuration as shown in FIG. 4C. Such a stacked arrangement is described in U.S. Pat. No. 5,707,745, the disclosure of which is hereby incorporated herein by reference. In the embodiment shown in FIG. 4C, blue 160, green 161 and red 162 organic layers are stacked one upon the other, with each organic layer separated one from the other by layers 151 and 152 to enable each device to receive a separate bias potential to emit light through the stack. In this embodiment, metal layers 152 which are positioned between organic materials (e.g., between layers 160 and 161, and between layers 161 and 162) are thin enough to be transparent, and metal layer 152 on top of the red organic layer 162, being the topmost conductive layer in the device, is thick enough to reflect impinging light beams. Each organic layer 160, 161 and 162 may be of either SH or DH type, as previously described. As shown in FIG. 4C, the stacked arrangement of organic layers 160, 161 and 162 is positioned on conductive layer 150. The emissive materials may be selected from those disclosed in U.S. Pat. No. 5,707,745 or references cited therein.

The emissive materials are preferably the highly efficient phosphorescent materials such as disclosed in U.S. Pat. No. 6,303,238; WO-0057676; WO-0070655; and WO-0141512, which are incorporated herein in their entirety by reference. The deposition techniques for any of the above-listed materials are well-known in the art. For example, a preferred method of depositing the organic layers is by organic vapor phase deposition (OVPD), such as disclosed in U.S. Pat. No. 6,337,102. Alternatively, the materials may be deposited using thermal evaporation or spin coating. A preferred method of depositing metal layers is by thermal or electron-beam evaporation or sputtering. A preferred method of depositing ITO is by electron-beam evaporation or sputtering. A preferred method of depositing the organic layers is by OVPD. A preferred method of depositing dielectrics is by plasma-enhanced chemical vapor deposition or electron-beam evaporation.

U.S. Pat. No. 6,245,393 ("the 393 patent"), the disclosure of which is hereby incorporated herein by reference, teaches the construction of high resolution, full-color displays using printing technologies that deliver small amounts of liquid inks to a substrate in a specified pattern (referred to herein as "ink jet printing"). The liquid inks of the present invention preferably comprise selected luminescent dyes and a host matrix in a liquid carrier medium. The liquid carrier medium is preferably water, an alcohol such as methanol, ethanol, or isopropanol, or mixtures of the same. The particular carrier medium is typically selected based on its ability to molecularly disperse the luminescent dyes and on its compatibility with the particular materials with which it comes into contact.

A preferred material for the conductive layers is a transparent electrically conductive oxide such as indium-tin oxide (ITO) or zinc indium-tin oxide (ZITO). One desirable property of indium-tin oxide is its ability to filter out destructive, high energy ultraviolet radiation, while being transparent to visible and near-ultraviolet radiation.

Such a layer can be formed by means of conventional sputtering or electron beam vapor deposition methods, and typically ranges in thickness from about 1000 to about 4000 Å. Below a certain thickness the resistance of the layer will begin to suffer, while above a certain thickness marginal utility becomes negligible. The deposition of such a layer is preferably conducted under vacuum.

After the conductive layer is deposited, the organic layer is preferably deposited by thermal evaporation methods. Preferably, the thickness of the organic layer will be as thin as possible to lower the voltage of the device, without significantly compromising quantum efficiency. The deposition of the organic layer is preferably conducted under vacuum. It is preferred that the device not be exposed to moisture, oxygen or other contaminants between the deposition of the conductive and organic layers.

The deposition of electrical contacts may be accomplished by vapor deposition or other suitable metal deposition techniques. These electrical contacts may be made from indium, platinum, gold, silver or combinations such as Ti:Pt:Au, Cr:Au or Mg:Ag. Mg:Ag contacts are preferred.

In view of the above, it can be seen that the display devices of the present invention are appropriate for an extremely wide variety of applications including billboards and signs, computer monitors, handheld devices such as personal digital assistants and other Internet appliances, telecommunications devices such as telephones, televisions, large area wall screens, theater screens and stadium screens.

The inventors have demonstrated that ordered microlens arrays with poly-dimethyl-siloxane (PDMS) lenses of diameter d~10 $\mu$m, attached to glass substrates increase the light output of organic light emitting devices (OLED) by a factor of 1.5 over unlensed substrates. The lenses, which are considerably smaller than, and need not be aligned to the OLEDs, outcouple light that is emitted outside the escape cone of the substrate. It is shown that an electrophosphorescent device based on a fac tris(2-phenylpyridine)iridium (Ir(ppy)$_3$) doped emitting layer has its external quantum efficiency increased from 8% using a flat glass substrate, to 12% using a substrate with mircolenses. No change in the emission spectrum is observed for different viewing angles using the lens arrays.

Introduction

A shortcoming of both inorganic and organic light emitting devices (referred to as LEDs and OLEDs, respectively) is that only a small fraction of the light generated in the device can escape due to total internal reflection (TIR) in the high refractive index substrates. The recent demonstration of OLEDs with an external quantum efficiency of $\eta_{ext}$ of 19% indicate that, like LEDs, these devices an have an internal quantum efficiency of ~100%. Light which is emitted outside of a narrow escape cone suffers TIR, as well as waveguiding within the device active layers, which means that almost 80% of the generated light is lost due to waveguiding and TIR in the glass substrates.

Methods employed to overcome these limitations, therefore, concentrate on expanding the escape cone of the substrate and suppressing the waveguide modes. These methods include introducing rough or textured surfaces, mesa structures and lenses, and the use of reflecting surfaces or distributed Bragg reflectors. Furthermore, it has been shown that two dimensional photonic crystals enhance the outcoupling of light along the surface normal.

Consequently, many of the methods used to improve LED outcoupling have also been applied to OLEDs. For polymer LEDs it was shown that a corrugated substrate increased the light output by a factor close to two by Bragg-scattering in the forward direction. A similar improvement was achieved by placing a single millimeter sized hemispherical lens on the substrate aligned with the OLED on its opposite surface. Also, shaping of the device into a mesa structure showed an increase of $\eta_{ext}$ by a factor of two. The incorporation of monolayers of silica spheres with a diameter of 550 nm as a scattering medium in a device or the positioning of these monolayers on the substrate also showed enhanced light output. Tsutsui, et al. showed recently that the external quantum efficiency can be doubled by incorporating a thin layer of low refractive index silica aerogel (n~1.03) in the device (T. Tsutsui, M. Yahiro, H. Yokogawa, K. Kawano, and M. Yokoyama, Adv. Mater. 13, 1149–1152 (2001)). Although a significant increase of $\eta_{ext}$ was observed for the reported methods, they are often accompanied by changes in the radiation pattern, angle dependent emission spectra, and costly or complex processing methods.

Here, an enhancement of the outcoupling efficiency is demonstrated by using an ordered array of microlenses. The lenses are produced using a simple fabrication process, and require no alignment with the OLEDs. Furthermore the emission spectra of the lensed OLEDs exhibit no angle dependence. The optical properties of the lens sheets are modeled by a simple ray tracing calculation, which predicts an increase of $\eta_{ext}$ by a factor of two compared to an unlensed glass surface. In particular the light output for high angles of observation with respect to the surface normal is considerably increased. The external quantum efficiency of an electro-phosphorescent device based on Ir(ppy)$_3$ emission layer is found to increase from 8% using a flat glass substrate, to 12% using a substrate with a micromolded lens array.

Theory of Microlens Array Performance

The optical properties of square arrays of hemispherical microlenses with lens diameter d=10 μm can be described by ray optics. A one-dimensional ray tracing calculation was performed to model the optical properties of the microlenses assuming a typical OLED structure (inset in FIG. 5), grown on a glass substrate (d=1 mm) of refractive index n=1.46. Indium tin oxide (ITO) with a thickness of 150 nm and a refractive index of n=1.8 on the glass serves as the anode contact. The organic layers have a total thickness of d=100 nm consisting of a hole transport layer (HTL), light emitting layer (EML) and an electron transport layer (ETL). The refractive indices of the HTL (4,4'-bis [N-(1-naphtyl)-N-phenyl-amino] biphenyl, α-NPD, n=1.78) and the ETL (tris(8-hydroxyquinoline) aluminum, $Alq_3$, n=1.72) are taken from the literature. For simplicity the metal cathode is assumed to be an ideal reflector. Microcavity effects and waveguiding are not considered since the microlenses do not significantly affect these processes.

Light generated in the emitting layer under the circular metal cathode (d=1 mm) is traced through the device considering refraction at interfaces between layers with different refractive indices. The secondary rays due to Fresnel reflection at these interfaces are also taken into account if the reflected intensity is greater than 0.5%. The calculation shows that the ratio between lensed and unlensed substrates does not change if only rays are taken into account which reach the lenses no more than 10 mm away from the metal cathode compared to a full calculation of all angles.

Rays that are emitted along or almost parallel to the substrate surface are lost in both cases since they leave the substrate at the edge. The rays escaping the OLED structure are summed to determine the far field radiation pattern as well as the integrated intensity with and without lenses. Rays that approach the flat glass substrate at an angle of incidence higher than the critical angle of the glass substrate, suffer total internal reflection. When the surface is coated with microlenses, however, the angle of incidence of rays can be smaller than the critical angle leading to their extraction. In addition, the slightly smaller refractive index of the polymer (n=1.4) used to fabricate the lenses leads to a slightly greater critical angle compared to that of glass.

Figure 5:
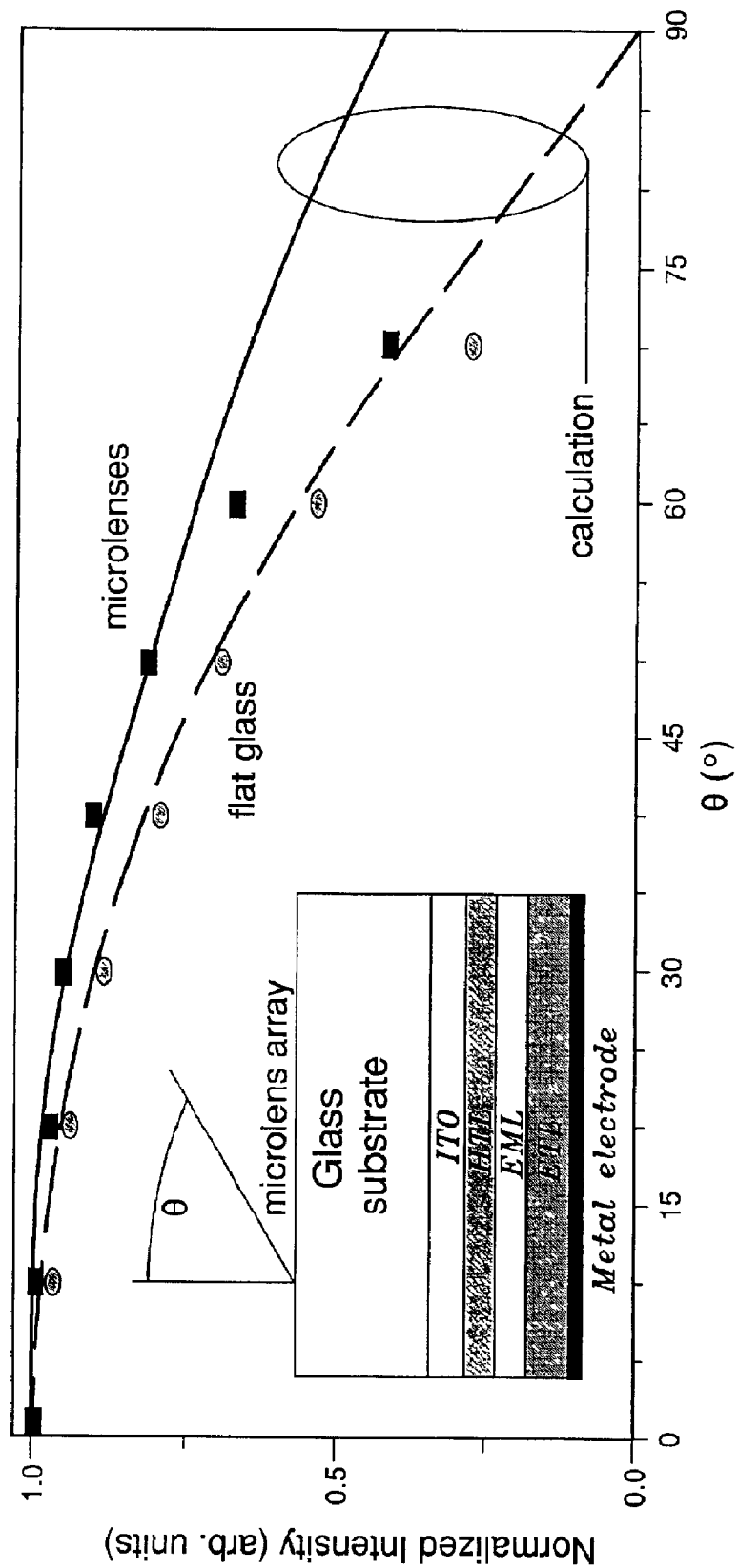
FIG. 5 shows the calculated far field radiation pattern of an OLED with flat glass surface and with a microlens array.

FIG. 5 shows the calculated far field radiation pattern of an OLED with flat glass surface (dashed line) and with a microlens array (solid line). A substrate thickness of d=1 mm was used for the calculation for the flat glass (dashed line) and the lensed substrate (solid line) corresponding to the substrates used for the devices. The inset shows the modeled OLED structure.

For high angles of observation with respect to the substrate surface normal, the mircolenses significantly enhance the outcoupling efficiency. In order to obtain the overall outcoupled intensity, both, the radiation pattern with and without lenses were integrated over the angle from 0° to 90°. To estimate the ratio for a surface covered with lenses the previous result was integrated over all of the viewing half space. While this integration is a simplification of the actual optical system, ignoring microcavity effects, lens array symmetry, and waveguide losses, the value can be taken as upper limit for comparison of the outcoupling efficiency compared with that of a flat glass substrate.

The outcoupling efficiency with microlenses is predicted to be increased by a factor of 2.3 compared to the flat glass substrate. The lens diameter has no significant influence on the extraction efficiency of light from the substrate. However, if the lenses diameter is comparable to the size of the device (d>200 μm) the radiation pattern shows peaks, which correspond to single lenses and shows that alignment of the lenses becomes important. Furthermore, the substrate thickness is important if the microlenses are used for image viewing, e.g., display applications. Since the microlenses expand the escape cone of the substrate, the illuminated area on the glass-air interface becomes larger. If the substrate is thick this leads to a large effective pixel size on the outcoupling surface and thus overlap of adjacent pixels. This is then perceived by the eye as a blurred image. Therefore, for image viewing it is preferred that the substrate thickness is not more than ~0.5 mm or the pitch of the pixels should be increased.

Lens Fabrication

Figure 6:
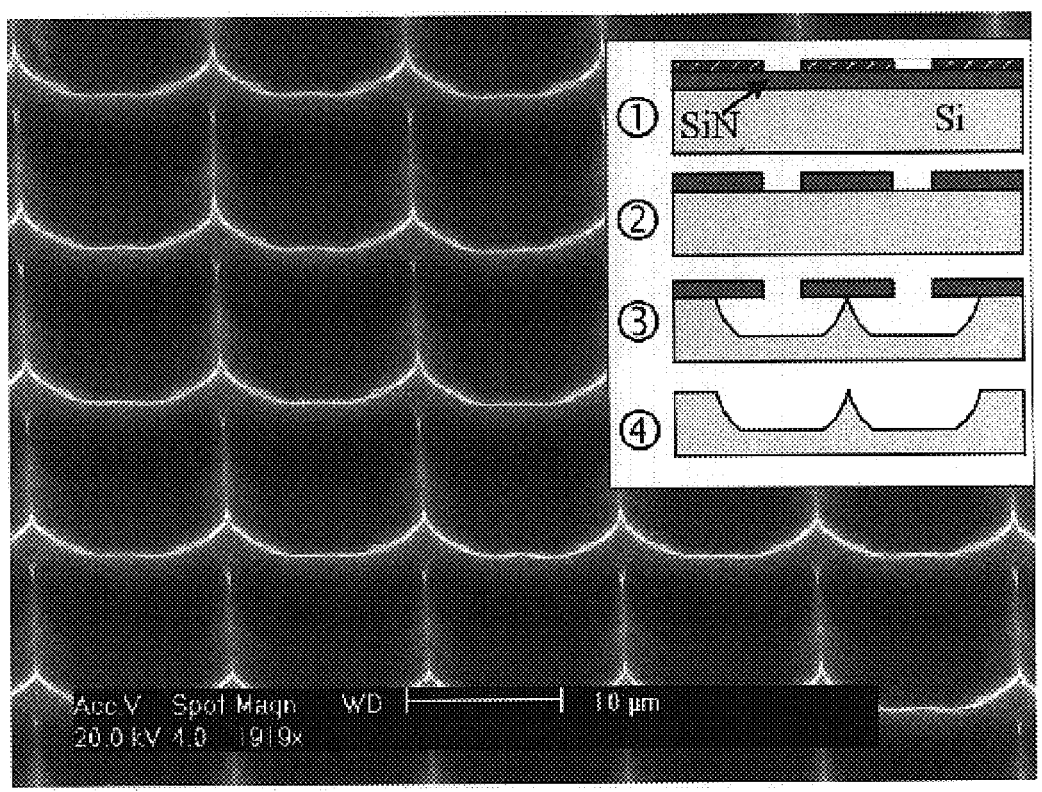
FIG. 6 is a scanning electron micrograph (SEM) of a silicon mold used for fabrication of mircolenses according to the invention.

FIG. 6 is a scanning electron micrograph (SEM) of the silicon mold used for fabrication of the mircolenses. Arrays of microlenses were fabricated using a mold transfer process shown schematically in the inset of FIG. 6. A silicon wafer was coated with a 1 μm thick layer of $SiN_x$ by plasma enhanced chemical vapor deposition. A square hole pattern (6×6 μm) is then etched into the $SiN_x$ using standard lithographic techniques (1). After removing the photoresist (2) the Si mold is wet-etched in 8:1:1, HNO3:CH3COOH:HF using the $SiN_x$ layer as a mask (3). Since the $SiN_x$ is undercut in the wet-etch process, the shape of the resulting mold strongly depends on the size and shape of the pattern in this layer. Finally the $SiN_x$ is removed from the silicon wafer by selective etching in HF (4).

FIG. 6 shows a scanning electron micrograph (SEM) of the silicon mold after wet-etching and removal of the $SiN_x$. A spacing between the etched wells of ~400 nm is achieved for a 25s etch of the Si and the depth of the wells is 4 μm±0.1 μm, corresponding to the undercut of the $SiN_x$ by the isotropic etchant. To fabricate an array of microlenses, the mold is subsequently filled with poly-di-methyl-siloxane (PDMS), a thermally curable elastomer. The PDMS is cured at 60° C. for two hours leading to a flexible sheet that can easily be peeled of the mold. The thickness of the PDMS layer is typically 100–300 μm. Since PDMS sticks tightly to glass but poorly adheres to Si after it is cured, the PDMS precursor can be confined between the mold and a glass substrate. After curing, the PDMS remains on the glass substrate when the latter is separated from the mold. This leads to a very thin PDMS sheet with lenses (diameter d~10 μm).

Figure 7:
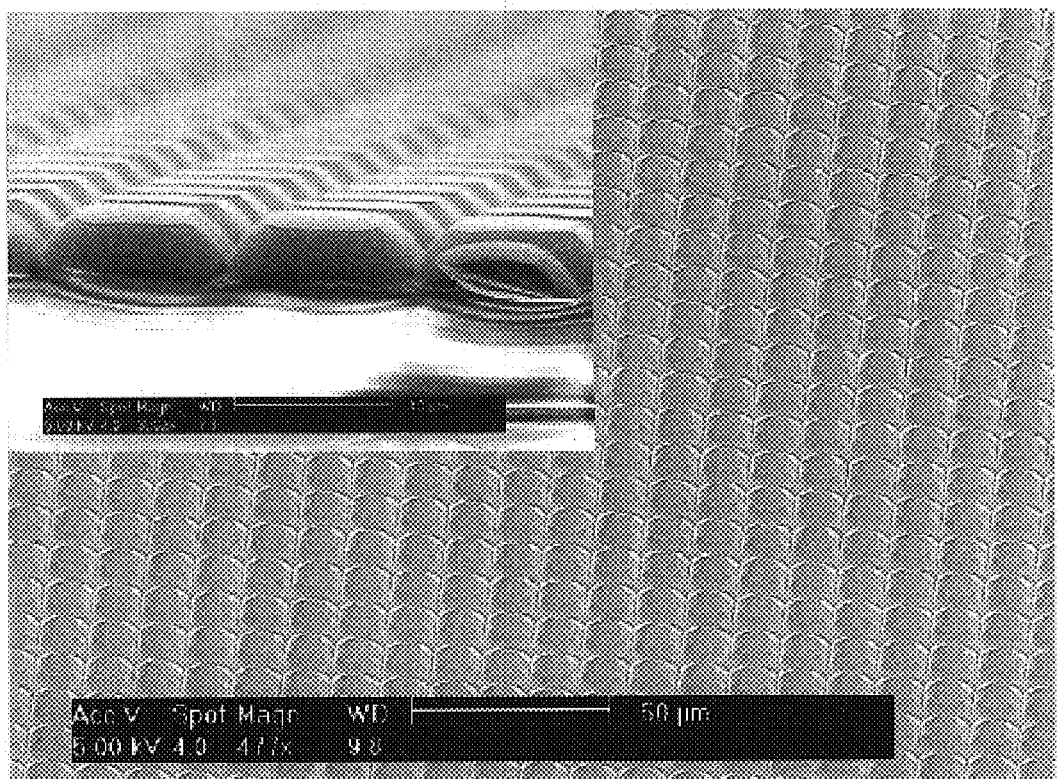
FIG. 7 is a SEM photograph of a PDMS microlens array fabricated from the mold shown in FIG. 6.

FIG. 7 is a SEM photograph of a PDMS microlens array fabricated from the mold shown in FIG. 6. Large areas can be covered with an ordered array of microlenses, only limited by the size of the mold. A magnified side view of the lenses (inset in FIG. 7) confirms that PDMS accurately reproduces the shape of the mold.

Application to OLEDs

To determine the effects of the microlens arrays, they were attached to OLEDs previously fabricated on flat glass substrates. The organic layers of the OLEDs were deposited by high vacuum (base pressure ~10–6 Torr) thermal evaporation onto a cleaned glass substrate precoated with an indium-tin-oxide (ITO) layer with a sheet resistance of ~20Ω/. A 50 nm thick film of 4,4'-bis[N,N'-(3-tolyl)amino]-3,3'-dimethylbiphenyl (HMTPD) served as the HTL. The EML consisted of 6% to 8% of the phosphor fac tris(2-phenylpyridine)iridium $Ir(ppy)_3$, doped into the electron-transporting 3-phenyl-4-(1'-naphthyl)-5-phenyl-1,2,4-triazole (TAZ) via thermal co-evaporation. A 40 nm thick ETL of tris-(8-hydroxy quinoline)aluminum ($Alq_3$) was used to transport and inject electrons into the EML. A shadow mask with 1 mm diameter openings was used to define the cathode contact consisting of a 75 nm thick Mg—Ag layer with a 75 nm thick Ag cap layer. In past reports, similar Mg:Ag/Alq$_3$/Ir(ppy)$_3$:TAZ/HMTPD/ITO devices deposited onto flat glass substrates have exhibited external quantum efficiencies of ηext=19%.

Figure 8:
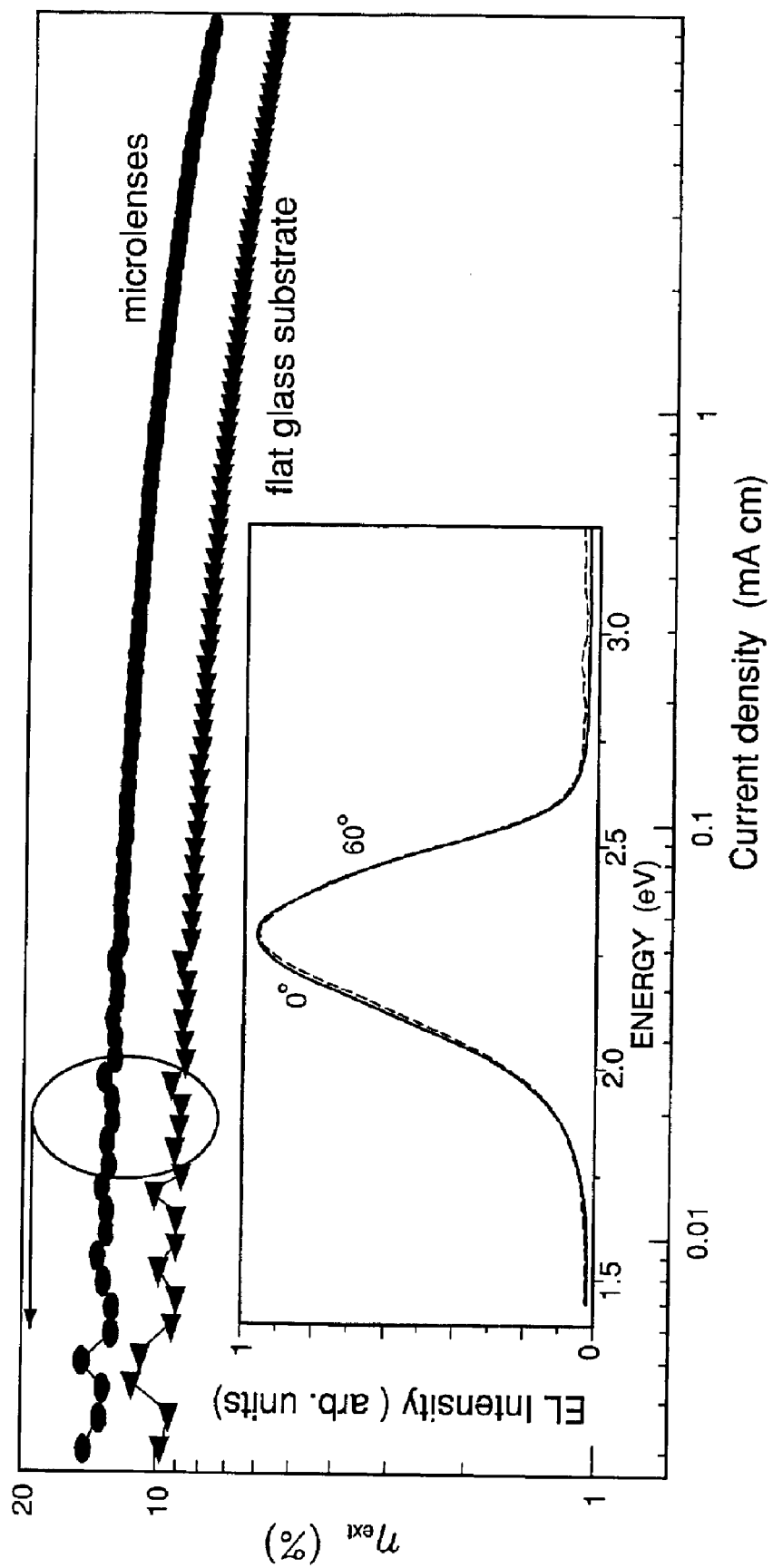
FIG. 8 shows $\eta_{ext}$ versus current density for an OLED with and without microlenses.

FIG. 8 shows $\eta_{ext}$ versus current density for an Ir(ppy)$_3$ doped phosphorescent OLED with and without the microlenses attached to the substrate surface. The inset shows the spectra of the OLED with lenses measured parallel to (solid line) and 60° from (dashed line) the surface normal. The efficiency $\eta_{ext}$ of the device without lenses is 8% at a current density of 0.1 mA/cm2 whereas attachment of the lenses leads to an increase of $\eta_{ext}$ by a factor of 1.5, to 12%. The radiation pattern (symbols in FIG. 5) of the OLED with and without the lenses show that the lenses enhance the light outcoupling as predicted in our simple calculations. Since the sample holder partially shaded the photodetector for high angles (<60°) the experimental value are below the calculated ones. Since the microlenses increase the effective critical angle for total internal reflection, light that would be guided in the flat substrate is extracted out of the device. Thus the light intensity is enhanced particularly at high viewing angles with respect to the substrate normal as compared to the flat glass surface.

The spectra of the OLED with microlenses parallel (solid line) and 60° from the substrate normal (dashed line) are shown in the inset of FIG. 8. The spectrum does not vary with viewing angle, confirming that the microlenses simply redirect the light without introducing microcavities or other undesirable parasitic optical effects. The application to displays based on OLEDs however requires the substrate and the lens sheet to be thin (~0.5 mm) in order to maintain the resolution of display pixels. Since the lenses increase the effective escape cone of the glass substrate, the escape cones of two adjacent pixels eventually will overlap on the outcoupling surface, leading to a decrease in image resolution. To obtain a high resolution display, therefore, the thickness of the substrate with the lenses should be minimized.

Figures 9A, 9B:
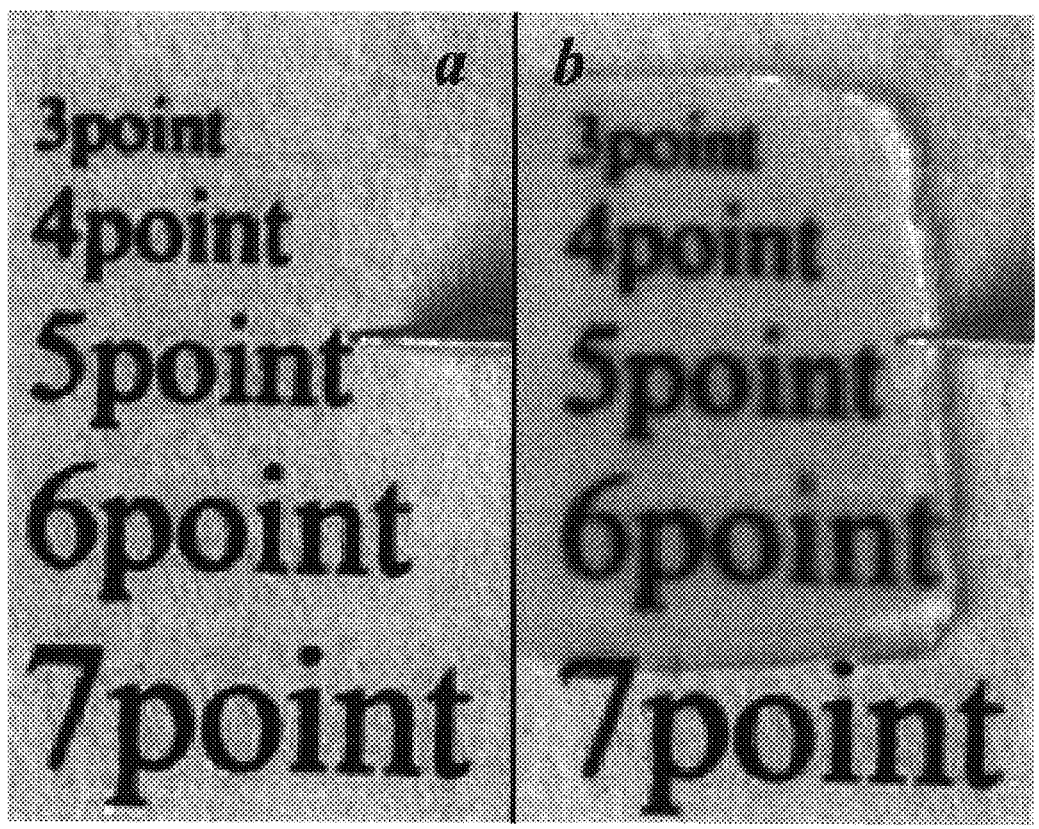
FIG. 9a shows a photograph of 200 μm thick lens sheet on a 150 μm thick cover glass on top of text printed in different font sizes on a 600 dpi laser printer.
FIG. 9b shows the printout of FIG. 9a without cover glass and lenses.

FIG. 9a shows a photograph of 200 µm thick lens sheet on a 150 µm thick cover glass on top of text printed in different font sizes on a 600 dpi laser printer. For comparison, FIG. 9b shows the same printout without cover glass and lenses. The edges of the letters underneath the microlenses are slightly blurred in this magnified photograph, but even the smallest letters (3 point±1.5 mm), which are hardly resolved in its original size on any conventional monitor, are clearly resolved. This shows that the mircrolens arrays can easily be applied to displays if the substrate and lens sheet thickness is optimized. However this consideration is eliminated for large area OLEDs employed in lighting applications, when image viewing is not required.

Figure 10:
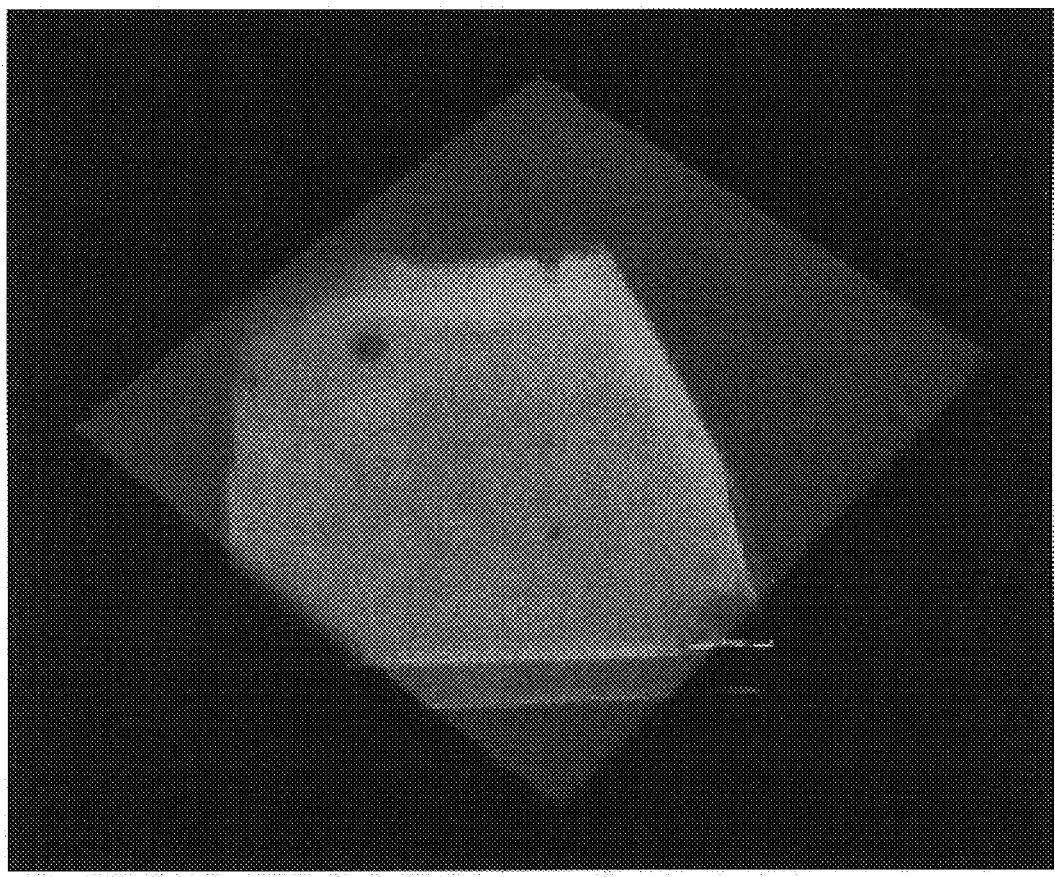
FIG. 10 is a photograph of a large area OLED (1 inch×1 inch) which is partly covered by a PDMS lens sheet.

The enhanced extraction efficiency of light out of the glass substrate of such an OLED (1 inch×1 inch) by attaching a microlens sheet is shown in the photograph in FIG. 10. FIG. 10 is a photograph of a large area OLED (1 inch×1 inch) which is partly covered by a PDMS lens sheet. The covered area is significantly brighter than the uncovered parts, demonstrating the enhanced extraction of light out of the substrate by the microlenses. The photograph was taken at an angle of about 45°. The area of the OLED, which is covered by the lens sheet, is significantly brighter than the uncovered parts especially for high angles of observation.

Conclusion

Thus it has been shown that microlens arrays according to the invention can increase the external quantum efficiency of OLEDs by a factor of at least 1.5, resulting in a considerable decrease in power consumption of the organic devices. The increase of $\eta_{ext}$ by 50% agrees with estimations obtained from a simple ray tracing model that ignores waveguiding and other optical losses. The microlenses primarily widen the escape cone for total internally reflected light incident at the air-substrate boundary. Thus the extraction of light at angles higher than the critical angle of glass is enhanced. Since the size of the lenses is ~10 µm, no color change of the spectrum is observed. Furthermore the dense packing of the microlenses makes alignment with the OLEDs unnecessary. The fabrication process by molding allows for simple and large area fabrication, making these arrays applicable to lighting as well as displays applications.

Those with skill in the art may recognize various modifications to the embodiments of the invention described and illustrated herein. Such modifications are meant to be covered by the spirit and scope of the appended claims.

What is claimed is:

1. A light emitting device comprising:
    at least one OLED having a minimum planar dimension and comprising:
        a first electrode;
        a second electrode; and
        an organic layer disposed between said first electrode and said second electrode; and
    a substrate disposed on a surface of said second electrode, said substrate having a plurality of microlenses disposed on a surface thereof, each of said microlenses having a minimum planar dimension and a maximum planar dimension;
    wherein said maximum planar dimensions of said microlenses are smaller than the minimum planar dimension of said at least one OLED; and
    wherein said organic layer emits light upon application of a voltage between the first and second electrodes, said light having a wavelength that is smaller than the smallest minimum planar dimension of the microlenses.

2. The device of claim 1, wherein said organic layer comprises an electron transporting layer and electroluminescent layer.

3. The device of claim 1, wherein said organic layer comprises a hole transporting layer.

4. The device of claim 1, wherein each of said microlenses has a generally rectangular planar base.

5. The device of claim 1, wherein said maximum planar dimensions of said microlenses are at least an order of magnitude smaller than the minimum planar dimension of the OLED.

6. The device of claim 1, wherein said minimum planar dimensions of said microlenses are at least an order of magnitude larger than said wavelength of said emitted light.

7. The device of claim 1, wherein said microlenses are generally mesa-shaped.

8. The device of claim 1, wherein the maximum planar dimension of each of said microlenses ranges from about 2 micrometers to about 8 micrometers.

9. The device of claim 1, wherein the maximum planar dimension of each of said microlenses ranges from about 4 micrometers to about 6 micrometers.

10. The device of claim 1, wherein the maximum planar dimension of each of said microlenses is about 5 micrometers.

11. A method for the preparation of a light emitting device, said method comprising:
    attaching a microlens array to a surface of a light emitting device that comprises a plurality of OLEDs, each of said OLEDs having a minimum planar dimension and emitting light having a respective wavelength;

wherein said microlens array comprises a plurality of generally mesa-shaped microlenses, each of said microlenses having a maximum planar dimension that is larger than a maximum wavelength of light emitted from said OLEDs and smaller than the minimum planar dimension of said OLEDs.

12. The method of claim 11, wherein said microlens array is a polymer laminate.

13. The method of claim 12, wherein said polymer laminate is a polymer selected from polymethylmethacrylates, polyvinylcarbazoles, polybutadienes, polyethylenes and polyesters.

14. The method of claim 11, wherein said microlens array is attached to said surface by physical or chemical bonding.

15. The method of claim 11, wherein said attaching of said microlens array is performed by forming said array on said surface of said substrate.

16. A method for the preparation of a light emitting device, said device comprising a plurality of OLEDs, said OLEDs having a minimum planar dimension; the method comprising:

providing a substrate, said substrate having a microlens array disposed on a first surface thereof;

depositing a first electrode on a second surface of said substrate;

depositing an organic layer on a surface of said first electrode; and depositing a second electrode on a surface of said organic layer;

wherein said microlens array comprises a plurality of generally mesa-shaped microlenses, each of said microlenses having a maximum planar dimension that is larger than a maximum wavelength of light emitted from said OLEDs and smaller than the minimum planar dimension of said OLEDs.

* * * * *